United States Patent
Müllner

(10) Patent No.: US 10,408,215 B2
(45) Date of Patent: Sep. 10, 2019

(54) ELECTRICALLY DRIVEN MAGNETIC SHAPE MEMORY APPARATUS AND METHOD

(71) Applicant: BOISE STATE UNIVERSITY, Boise, ID (US)

(72) Inventor: Peter Müllner, Boise, ID (US)

(73) Assignee: BOISE STATE UNIVERSITY, Boise, ID (US)

( * ) Notice: Subject to any disclaimer, the term of this patent is extended or adjusted under 35 U.S.C. 154(b) by 923 days.

(21) Appl. No.: 14/493,674

(22) Filed: Sep. 23, 2014

(65) Prior Publication Data
US 2016/0087553 A1    Mar. 24, 2016

(51) Int. Cl.
| F04D 13/06 | (2006.01) |
| H01L 41/12 | (2006.01) |
| F04B 43/04 | (2006.01) |
| H01F 1/03 | (2006.01) |
| F04B 17/03 | (2006.01) |
| F04B 19/00 | (2006.01) |
| F04B 43/12 | (2006.01) |

(52) U.S. Cl.
CPC .............. *F04D 13/06* (2013.01); *F04B 17/03* (2013.01); *F04B 19/006* (2013.01); *F04B 43/043* (2013.01); *F04B 43/12* (2013.01); *H01F 1/0308* (2013.01); *H01L 41/12* (2013.01); *F05C 2251/08* (2013.01); *F05C 2251/12* (2013.01)

(58) Field of Classification Search
CPC ........ F04D 13/06; F04B 43/12; F04B 19/006; F04B 17/03; F04B 43/043; H01F 1/0308; H01L 41/12; F05C 2251/12

See application file for complete search history.

(56) References Cited

U.S. PATENT DOCUMENTS

| 5,961,298 | A | * | 10/1999 | Bar-Cohen | ............ F04B 19/006 417/322 |
| 6,074,179 | A | * | 6/2000 | Jokela | ...................... F04B 43/04 417/322 |
| 6,515,382 | B1 | * | 2/2003 | Ullakko | .................. F16D 65/14 310/26 |
| 2002/0081218 | A1 | * | 6/2002 | Sharma | ................. F04B 43/043 417/322 |
| 2002/0098098 | A1 | * | 7/2002 | Miesner | ................ F04B 43/095 417/477.1 |

(Continued)

OTHER PUBLICATIONS

Schiepp et al. "Magnetic Shape Memory Actuators for Fluidic Applications"; Mar. 24, 2014.*

(Continued)

*Primary Examiner* — Charles G Freay
*Assistant Examiner* — Lilya Pekarskaya
(74) *Attorney, Agent, or Firm* — Parsons Behle & Latimer

(57) ABSTRACT

An actuation apparatus may include a magnetic shape memory (MSM) element configured to contract locally at a portion of the MSM element in response to local exposure to a magnetic field distribution component that is substantially perpendicular to a longitudinal axis of the MSM element. The apparatus may further include a plurality of conductive coils laterally offset from the MSM element. Central axes of each conductive coil of the plurality of conductive coils may be substantially parallel to a longitudinal axis of the MSM element.

14 Claims, 4 Drawing Sheets

(56) References Cited

U.S. PATENT DOCUMENTS

| | | | | |
|---|---|---|---|---|
| 2002/0108446 A1* | 8/2002 | Matsuki | ............... | G01B 7/003 |
| | | | | 73/661 |
| 2005/0001367 A1* | 1/2005 | Taya | ............... | H02N 2/10 |
| | | | | 267/166 |
| 2006/0144472 A1* | 7/2006 | Ullakko | ............... | B06B 1/045 |
| | | | | 148/104 |
| 2009/0115284 A1* | 5/2009 | Liang | ............... | H01L 41/12 |
| | | | | 310/300 |
| 2012/0275929 A1* | 11/2012 | Salsman | ............... | F04B 43/04 |
| | | | | 417/53 |
| 2013/0091954 A1* | 4/2013 | Ullakko | ............... | G01L 1/127 |
| | | | | 73/779 |
| 2014/0091646 A1* | 4/2014 | Schiepp | ............... | H01L 41/12 |
| | | | | 310/26 |
| 2014/0111045 A1* | 4/2014 | Goepel | ............... | H02K 41/06 |
| | | | | 310/83 |
| 2016/0086756 A1* | 3/2016 | Bang | ............... | H01F 7/1615 |
| | | | | 361/160 |

OTHER PUBLICATIONS

Smith et al., Controlling twin variant configuration in a constrained Ni—Mn—Ga sample using local magnetic fields, Scripta Materialia, Jan. 31, 2014, 68-70, vol. 77, Elsevier Ltd. Jan. 31, 2014.
Ullakko et al., A magnetic shape memory micropump: contact-free, and compatible with PCR and human DNA profiling, Smart Materials and Structures, Oct. 4, 2012, No. 11, vol. 21, IOP Publishing Ltd., United States. Oct. 4, 2012.

* cited by examiner

ELECTRICALLY DRIVEN MAGNETIC SHAPE MEMORY APPARATUS AND METHOD

FIELD OF THE DISCLOSURE

The present disclosure relates generally to electrically driven magnetic shape memory apparatuses and methods.

BACKGROUND

Micropumps may be employed in applications where it is desirable to transmit small volumes (e.g., sub-microliter volumes) of fluid from one location to another. For example, micropumps may be used to deliver small doses of drugs to a subject over a period of time.

Some micropumps operate by generating a magnetic field to actuate a pumping mechanism. For example, the magnetic field may produce deformations in a magnetic shape memory (MSM) element. The deformations may be used to carry a fluid. Changes in the magnetic field may alter a position of the deformations thereby moving the fluid through the micropump. Often, a permanent magnet is used to generate the magnetic field. Rotating the permanent magnet may produce the changes to the magnetic field that actuate the pumping mechanism.

Micropumps that use permanent magnets to generate a magnetic field for actuating a pump mechanism may be too large and bulky for some applications. Further, the permanent magnets may produce stray magnetic fields that may negatively affect magnetically sensitive equipment or devices positioned near the micropump. Additionally, micropumps that use permanent magnets may provide less control over and less customizability of the magnetic field. For example, altering a strength of the magnetic field may be difficult when the magnetic field is generated by a permanent magnet.

SUMMARY

Disclosed is a micropump including an electrically driven MSM system that may resolve some of the disadvantages discussed above.

In an embodiment, an actuation apparatus includes a magnetic shape memory (MSM) element configured to contract locally at a portion of the MSM element in response to local exposure to a magnetic field distribution component that is substantially perpendicular to a longitudinal axis of the MSM element. The apparatus further includes a plurality of conductive coils laterally offset from the MSM element. Central axes of each conductive coil of the plurality of conductive coils are substantially parallel to the longitudinal axis of the MSM element.

In an embodiment, the apparatus further includes a plate in contact with a surface of the MSM element. The plate may have a first opening and a second opening defined therein. The apparatus may also include at least one anchor fixing a position of the MSM element relative to the plate, relative to the plurality of conductive coils, or both.

In an embodiment, the apparatus further includes a ferromagnetic core passing through the plurality of conductive coils along the central axes of each conductive coil of the plurality of conductive coils. The apparatus may also include one or more pole pieces coupled to the ferromagnetic core. The ferromagnetic core may include iron, nickel, cobalt, or a combination thereof. The apparatus may include a yoke coupled to the ferromagnetic core. The yoke may form a loop with the MSM element and the ferromagnetic core.

In an embodiment, the plurality of conductive coils includes at least three coils. Each of the central axes of each conductive coil of the three conductive coils may be aligned. The three conductive coils may be positioned at intervals along the MSM element.

In an embodiment, the apparatus further includes a controller coupled to the plurality of conductive coils. The controller may be configured to selectively reverse a direction of at least one electrical current of electrical currents applied through the plurality of conductive coils.

In an embodiment, a method includes applying electrical currents through a plurality of conductive coils to generate a magnetic field. The magnetic field has a magnetic field distribution component that is substantially perpendicular to a longitudinal axis of a magnetic shape memory (MSM) element. The method further includes selectively reversing a direction of at least one of the electrical currents to change a position of the magnetic field distribution component relative to the MSM element.

In an embodiment, the method the MSM element contracts locally and forms a neck at a portion of the MSM element in response to local exposure to the magnetic field distribution component at the portion. The MSM element may further uncontract at the portion of the MSM element and contracts at another portion of the MSM element in response to movement of the magnetic field distribution. A position of the neck may be changed in response to changing the position of the magnetic field distribution component.

In an embodiment, the neck forms a cavity between the MSM element and a plate. The method may further include pumping a substance from a first opening in the plate to a second opening in the plate via the cavity.

In an embodiment, selectively reversing the direction of the at least one of the electrical currents comprises successively reversing a direction of the electrical currents through multiple conductive coils of the plurality of conductive coils.

In an embodiment, the magnetic field has another magnetic field distribution component that is substantially parallel to the longitudinal axis of the MSM element. The MSM element may be stabilized at a portion of the MSM element in response to local exposure to the other magnetic field distribution component at the portion.

In an embodiment, a micropump apparatus includes a pump assembly. The apparatus further includes a conductive coil assembly positioned proximate to the pump assembly and including a plurality of conductive coils. The apparatus also includes a pump controller electrically coupled to the plurality of conductive coils. The pump controller may be configured to apply electrical currents through each of the plurality of conductive coils. The pump controller may be further configured to successively reverse a direction of electrical currents through at least one of the plurality of conductive coils.

In an embodiment, the pump controller is further configured to receive user input. A rate of successively reversing the direction of the electrical currents through at least one of the plurality of conductive coils may be determined based on the user input.

In an embodiment, the pump assembly, the conductive coil assembly, and the pump controller are implemented on or within an integrated circuit device.

Figure 1:
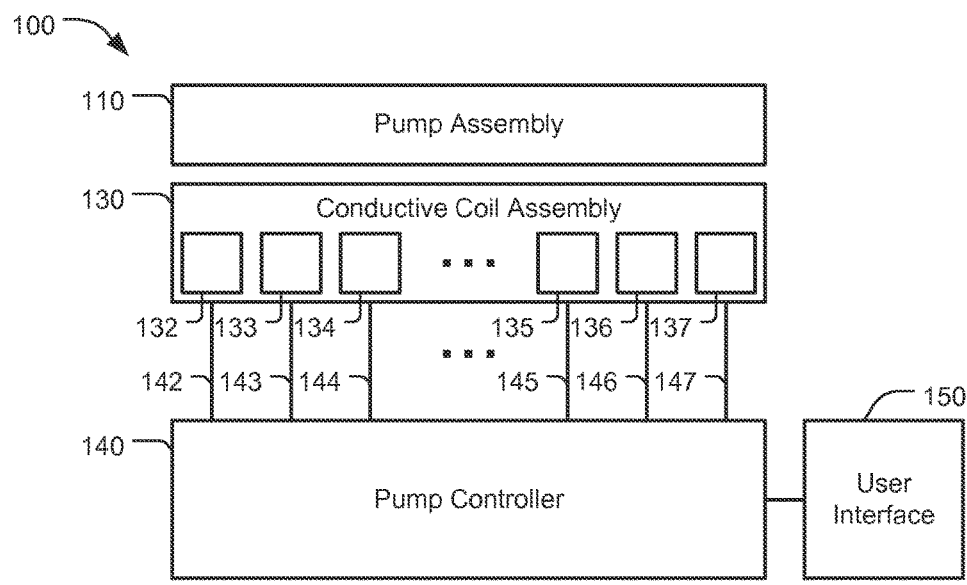
FIG. 1 illustrates a block diagram of an embodiment of an electrically driven magnetic shape memory (MSM) system.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

DETAILED DESCRIPTION

Referring to FIG. 1, a block diagram of an embodiment of an electrically driven magnetic shape memory (MSM) system is depicted and generally designated 100. The electrically driven MSM system 100 may include a pump assembly 110, a conductive coil assembly 130, and a pump controller 140.

The conductive coil assembly 130 may include a plurality of conductive coils 132-137. Each of the conductive coils 132-137 may be configured to generate a magnetic field in a first direction in response to receiving an electrical current and to generate a magnetic field in a second direction, opposite the first direction, in response to the electrical current being reversed. Further, the conductive coil assembly 130 may be positioned proximate to the pump assembly 130 such that such the pump assembly 110 is responsive to a magnetic field distribution generated by the plurality of conductive coils 132-137. Alterations to the magnetic field distribution generated by the conductive coil assembly 130 may actuate the pump assembly 110 to cause a fluid to be pumped through the pump assembly 110, as described herein. Although FIG. 1 depicts the conductive coil assembly 130 as including six conductive coils, it should be understood that the conductive coil assembly 130 may include more or fewer than six conductive coils.

The conductive coil assembly 130 may be electrically coupled to the pump controller 140 via a plurality of connections 142-147. For example, the plurality of connections 142-147 may electrically couple the pump controller 140 to the plurality of conductive coils 132-137 enabling the pump controller 140 to control a magnetic field direction at each coil of the plurality of conductive coils 132-137 within the conductive coil assembly 130. For example, by applying an electrical current to the connections 142-147, the pump controller 140 may apply electrical currents to the plurality of conductive coils 132-137.

During operation, the pump controller 140 may apply currents to the plurality of conductive coils such that a first set of conductive coils (e.g., including the conductive coil 132) induces a magnetic field in a first direction and a second set of conductive coils (e.g., including the conductive coils 133-137) induces a magnetic field in a second direction, opposite the first direction. A resultant magnetic field distribution may include a compressed portion that passes through the left side of the pump assembly. The compressed portion of the magnetic field distribution may cause the pump assembly to receive an amount of fluid therein (e.g., at the left side of the pump assembly). The pump controller 140 may successively reverse a direction of electrical currents through multiple conductive coils of the conductive coils 132-137. For example, the pump controller 140 may reverse a direction of the conductive coils 133-136, starting with the conductive coil 133 and reversing a direction of the conductive coils 133-136 in turn, finishing with the conductive coil 136. By successively reversing a direction of the conductive coils 133-136, the pump controller 140 may cause the fluid to be pumped through the pump assembly 110 (e.g., from left to right). Alternatively, the pump controller 140 may successively reverse a direction of electrical currents through the coils 133-136, starting with the conductive coil 136 and reversing a direction of electrical currents through the conductive coils 133-136 in turn, finishing with the conductive coil 133, thereby pumping fluid through the pump assembly 110 (e.g., from right to left).

In an embodiment, the electrically driven MSM system 100 may include a user interface 150. The user interface 150 may be configured to receive input from a user. The user input may be used to determine a rate for pumping a fluid through the pump assembly 110. For example, the pump controller 140 may determine a rate of successively reversing the direction of the electrical currents through at least one of the conductive coils 133-136 based on the user input. In an embodiment, the user interface 150 includes an analog input device such as a variable resistor, a variable capacitor, a variable inductor, another type of analog input device, or a combination thereof. In an embodiment, the user interface 150 includes a digital input device such as digital buttons, a digital keypad, a keyboard, a touchscreen, another type of digital input device, or a combination thereof.

In an embodiment, the electronically driven MSM system 100 is implemented as an actuation apparatus. For example, the pump assembly 110, the conductive coil assembly 130, and the pump controller 140 may be incorporated into a micropump apparatus usable to pump fluid. In an embodiment, the micropump apparatus is implemented on or within an integrated circuit device. For example, the pump assembly 110, the conductive coil assembly 130, and the pump controller 140 may be formed within layers of an integrated circuit device.

By using the conductive coil assembly 130 including the plurality of conductive coils 132-137 to actuate the pump assembly 110, the electrically driven MSM system 100 may be more compact as compared to MSM systems that do not use conductive coils (e.g., MSM systems that use permanent magnets to actuate a pump assembly). Thus, the electrically driven MSM system 100 may applicable in a large number of applications where size is a limiting factor. Further, the electrically driven MSM system 100 may enable more control over a magnetic field distribution generated by the conductive coil assembly 130 than MSM systems that use permanent magnets to actuate a pump assembly.

Figure 2:
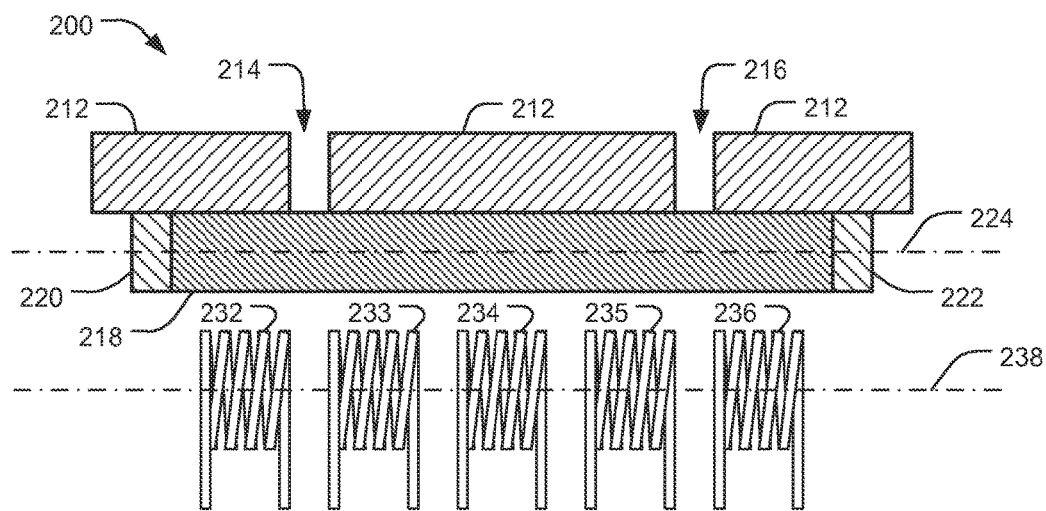
FIG. 2 illustrates a cross section diagram of an embodiment of an electrically driven MSM system.

Referring to FIG. 2, a cross section diagram of an embodiment of an electrically driven MSM system is depicted and generally designated 200. The electrically driven MSM system 200 may include a plate 212, anchors 220, 222, an MSM element 218, and a plurality of conductive coils 232-236. The plate 212, the anchors 220, 222, and the MSM element 218, may correspond to the pump assembly 110. One or more of the conductive coils 232-236 may correspond one or more of the conductive coils 132-137.

The plate 212 may include a first opening 214 and a second opening 216 defined therein. Each of the openings 214, 216 may be configured to receive fluid which may then be pumped to the other opening, as described herein.

The MSM element 218 may be elongated with a longitudinal axis 224 running substantially parallel to the plate 212. As used herein, being substantially parallel means that the longitudinal axis 224 is closer to being parallel to the plate 212 than to being perpendicular to the plate 212. The MSM element 218 may further be in contact with the plate 212 blocking a path from the first opening 214 to the second opening 216. For example, a surface of the plate may be in contact with a surface of the MSM element 218 to block the path between the first opening 214 and the second opening 216. The MSM element 218 may be configured to contract locally at a portion of the MSM element 218 in response to local exposure to a magnetic field distribution component that is substantially perpendicular (for example, closer to being perpendicular than to being parallel) to the longitudinal axis 224 of the MSM element 218. As the magnetic field distribution is applied to the MSM element 218 and altered, the MSM element 218 may pump fluid from one of the openings 214, 216 to the other opening, as described further with reference to FIGS. 3A-3D. The MSM element may include materials such as nickel, manganese, gallium, another type of material, or a combination thereof. Further descriptions and embodiments of the MSM element 218 may be described by U.S. patent application Ser. No. 13/550,386, filed on Jul. 16, 2012 and entitled, "Actuation Method and Apparatus, Micropump, and PCR Enhancement Method," hereby incorporated by reference in its entirety.

The anchors 220, 222 may be coupled to the MSM element 218 and may stabilize the MSM element 218 during operation of the electrically driven MSM system 200. For example, the anchors 220, 222 may fix a position of the MSM element 218 relative to the plate 212, relative to the conductive coils 232-236, or both. Although FIG. 2 depicts two anchors, in one or more other embodiments, the electrically driven MSM system 200 may include more or fewer than two anchors. In an embodiment, the MSM element 218 includes no anchors and is fit into an apparatus (not shown) and held in place by the plate 212.

The conductive coils 232-236 may be laterally offset from the MSM element such that central axes of each of the conductive coils 232-236 are substantially parallel (e.g., closer to being parallel than to being perpendicular) to the longitudinal axis 224 of the MSM element 218. In an embodiment the central axes of each of the conductive coils 232-236 are aligned along a central axis 238. The conductive coils 232-236 may be positioned at regular intervals along the MSM element 218. For example, the conductive coils 232-236 may be laterally offset from the MSM element 218 and positioned at regular intervals to form a path from the first opening 214 to the second opening 216. Although FIG. 2 depicts the electrically driven MSM system 200 as including five conductive coils, in one or more other embodiments, the electrically driven MSM system 200 may include more or fewer than five conductive coils. In an embodiment, the MSM system 200 includes at least three conductive coils.

Figure 3A:
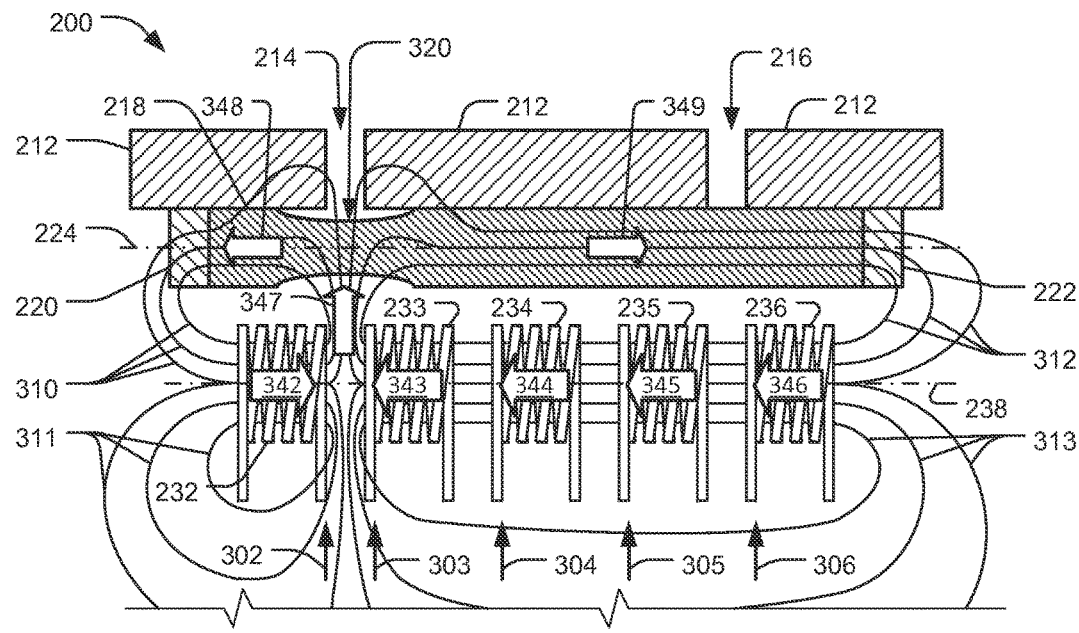
FIGS. 3A-3D illustrate cross section diagrams of an embodiment of an electrically driven MSM system depicted in a first, second, third, and fourth operating state, respectively.

The operation of the electrically driven MSM system 200 is described with reference to FIGS. 3A-3D. Referring to FIG. 3A, a cross section diagram of an embodiment of an electrically driven MSM system 200 is depicted in a first operating state. In the first operating state, electrical currents 302-306 may be applied to the conductive coils 232-236. For example, a controller (e.g., the controller 140) may apply currents to connectors (e.g., the connectors 142-147) electrically coupled to the conductive coils 232-236.

The currents 302-306 through the conductive coils 232-236 may generate a magnetic field distribution as represented by the magnetic field lines 310-313. The orientation of particular portions the magnetic field distribution, and the corresponding magnetic field lines 310-313, may be represented by magnetic field arrows 342-349. For example, the current 302 may be applied to the conductive coil 232 such that the current 302 flows through the conductive coil 232 in a first direction (passing through the coil 232 from right to the left). The current 302 may generate a portion of the magnetic field distribution that is orientated from left to right as depicted by the magnetic field arrow 342. Likewise, the currents 303-306 may be applied to the conductive coils 233-236 such that the currents 303-306 flow through the conductive coils 233-236 in a second direction that is opposite the first direction (passing through each of the coils 233-236 from left to right). The currents 303-306 may generate a portion of the magnetic field distribution that is orientated from right to left as depicted by the magnetic field arrows 343-346. Hence, in the first operating state, the conductive coil 232 may be used to generate a first portion of the magnetic field distribution orientated in a first direction as depicted by the magnetic field arrow 342 and the conductive coils 233-236 may be used to generate a second portion of the magnetic field distribution orientated in a second direction, opposite the first direction, as depicted by the magnetic field arrows 343-346.

The first and second portions of the magnetic field may converge between the conductive coil 232 and the conductive coil 233 resulting in a compressed portion of the magnetic field distribution. A component of the compressed portion of the magnetic field distribution may be orientated as depicted by the magnetic field arrow 347. For example, the component of the compressed portion of the magnetic field distribution may be substantially perpendicular (for example, closer to being perpendicular than to being parallel) to the central axis 238 of the conductive coils 232-236 and to the longitudinal axis 224 of the MSM element 218.

The MSM element 218 may contract locally at a portion of the MSM element 218 that is exposed to the substantially perpendicular component of the compressed portion of the magnetic field distribution. For example, the MSM element 218 may contract locally and form a neck at of the compressed portion of the magnetic field. In an embodiment, the MSM element 218 may compress in one dimension without compressing in the other two dimensions. To illustrate, the MSM element 218 may compress in a first dimension (for example, with reference to FIG. 3A, the first dimension running from the top of the page to the bottom of the page) without compressing in the other two dimensions (for example, the second dimension running from the left of the page to the right of the page and the third dimension running into the page and out of the page).

The neck may result in the formation of a cavity 320 between the plate 212 and the MSM element 218. While the electrically driven MSM system 200 is in the first state, fluid may be received in the cavity 320 from the first opening 214.

As shown in FIG. 3A, other component of the magnetic field distribution may be orientated as depicted by the magnetic field arrows 348, 349. For example, the other components of the magnetic field distribution may be substantially parallel (for example, closer to being parallel than perpendicular) to the longitudinal axis 224 of the MSM element 218. The MSM element 218 may be stabilized (inhibited from contracting) at a portion of the MSM element 218 in response to local exposure to the other magnetic field distribution components at the portion.

Figure 3B:
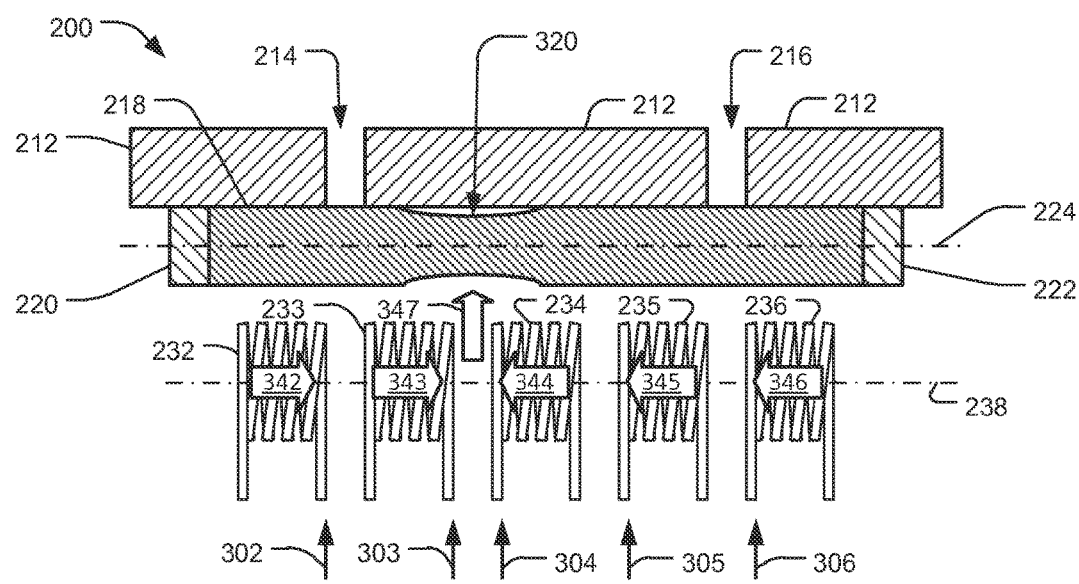

Referring to FIG. 3B, a cross section diagram of an embodiment of an electrically driven MSM system 200 is depicted in a second operating state. The electrically driven MSM system 200 may enter the second operating state by reversing a direction of the current 303 through the coil 233. For example, the current 303 may be applied such that the current 303 flows from right to left through the coil 233 instead of from left to right as in FIG. 3A, thereby inducing a magnetic field that passes from left to right as depicted by the magnetic field arrow 343.

In the second operating state, the conductive coils 232 and 233 may be used to generate a first portion of the magnetic field distribution orientated in a first direction as depicted by the magnetic field arrows 342, 343, and the conductive coils 234-236 may be used to generate a second portion of the magnetic field distribution orientated in a second direction, opposite the first direction, as depicted by the magnetic field arrows 344-346.

The first and second portions of the magnetic field may converge between the conductive coil 233 and the conductive coil 234 resulting in movement of the compressed portion of the magnetic field distribution and resulting in movement of the substantially perpendicular component (represented by the magnetic field arrow 347) of the magnetic field distribution as compared to FIG. 3A.

The movement of the substantially perpendicular component of the magnetic field distribution component may result in the movement of the neck. For example, the MSM element 218 may compress locally between the coil 233 and the coil 234 due to the local presence of the substantially perpendicular component of the magnetic field distribution and uncompress between the coil 232 and the coil 233 in the local absence of the substantially perpendicular component of the magnetic field distribution.

The movement of the neck may result in the further movement of the cavity 320. As the cavity 320 moves, following the substantially perpendicular portion of the magnetic field distribution, fluid received by the cavity during the first operational stage may be moved within the cavity 320 during the second operational stage. Hence, by reversing the electrical current 303 through the conductive coil 233, fluid may be moved (pumped) from a first location of the cavity 320 as depicted in FIG. 3A to a second location of the cavity 320 as depicted in FIG. 3B.

Figure 3C:
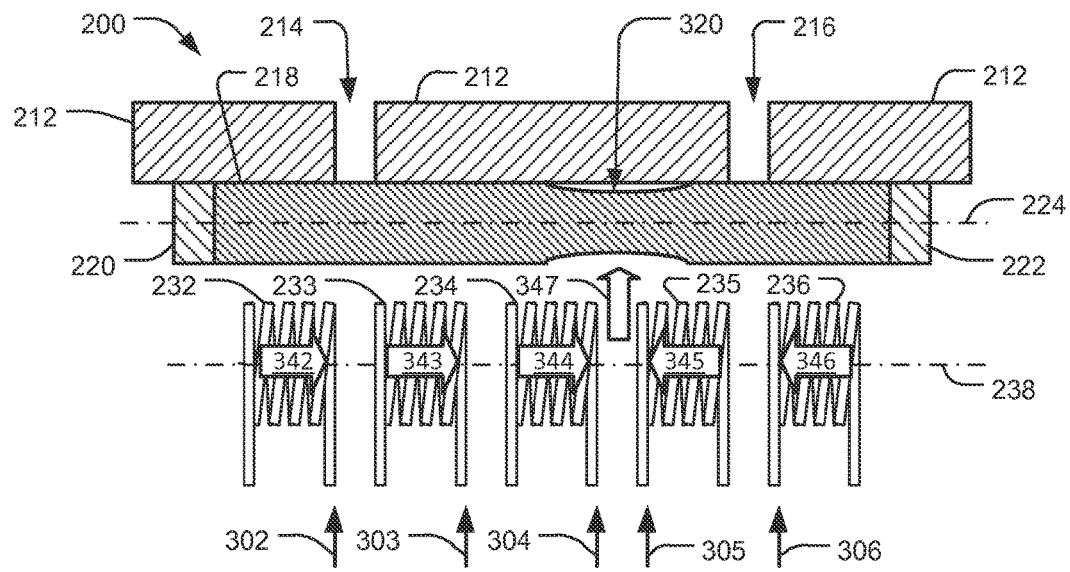

Referring to FIG. 3C, a cross section diagram of an embodiment of an electrically driven MSM system 200 is depicted in a third operating state. The electrically driven MSM system 200 may enter the third operating state by reversing a direction of the current 304 through the coil 234.

In the third operating state, the conductive coils 232-234 may be used to generate a first portion of the magnetic field distribution orientated in a first direction as depicted by the magnetic field arrows 342-344, and the conductive coils 235, 236 may be used to generate a second portion of the magnetic field distribution orientated in a second direction, opposite the first direction, as depicted by the magnetic field arrows 345, 346.

The first and second portions of the magnetic field may converge between the conductive coil 234 and the conductive coil 235 resulting in movement of the compressed portion of the magnetic field distribution and resulting in movement of the substantially perpendicular component (represented by the magnetic field arrow 347) of the magnetic field distribution as compared to FIG. 3B.

The movement of the substantially perpendicular component of the magnetic field distribution component may result in the movement of the cavity 320. By reversing the electrical current 304 through the conductive coil 234, fluid within the cavity 320 may be moved (pumped) from the second location of the cavity 320 as depicted in FIG. 3B to a third location of the cavity 320 as depicted in FIG. 3C.

Figure 3D:
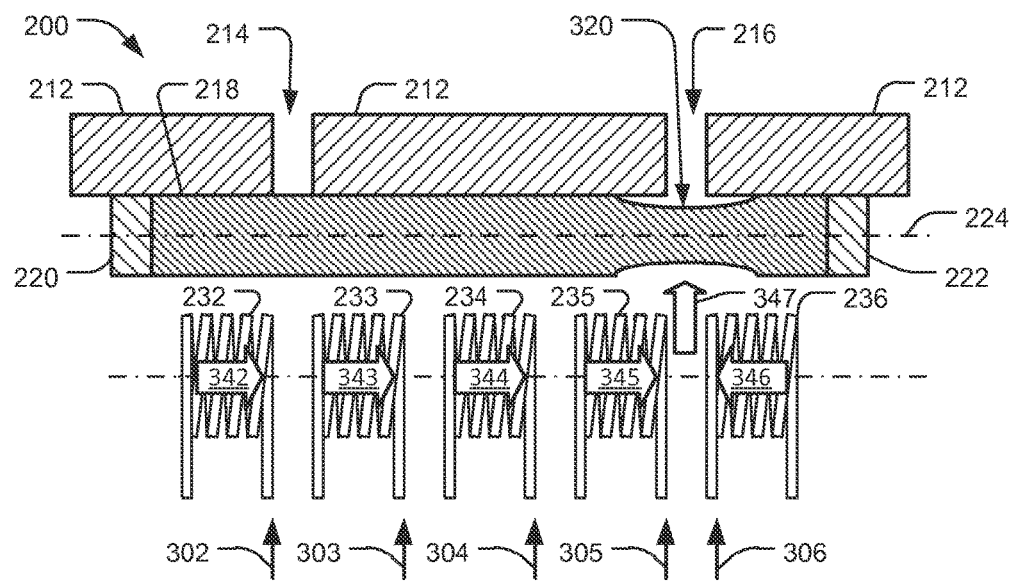

Referring to FIG. 3D, a cross section diagram of an embodiment of an electrically driven MSM system 200 is depicted in a fourth operating state. The electrically driven MSM system 200 may enter the fourth operating state by reversing a direction of the current 305 through the coil 235. By reversing the electrical current 305 through the conductive coil 235, fluid within the cavity 320 may be moved (pumped) from the third location of the cavity 320 as depicted in FIG. 3C to a fourth location of the cavity 320 as depicted in FIG. 3D.

While the electrically driven MSM system 200 is in the fourth state, fluid may be transmitted from the cavity 320 to the second opening 216. Hence, by progressively reversing multiple conductive coils (e.g., the conductive coils 233-235) fluid may have been pumped through the electrically driven MSM system 200 from the first opening 214 to the second opening 216. Although FIGS. 3A-3D depict the electrically driven MSM system 200 as pumping fluid from left to right, is should be understood that fluid may also be pumped through the electrically driven MSM system 200 from right to left by progressively reversing an electrical current through each of the coils 233-235, in starting with the coil 235.

Although the electrically driven MSM system 200 is depicted in FIGS. 3A-3D as including five conductive coils and including four operating states, in one or more other embodiments, the electrically driven MSM system 200 may include more or fewer than five conductive coils and may include more or fewer than four operating states. For example, in an embodiment, the electrically driven MSM system 200 includes at least three conductive coils and at least two operating states. In a first operating state, the cavity 320 may be adjacent to the first opening 214. In a second operating state, the cavity 320 may be adjacent to the second opening 216. In this embodiment, the electrically driven MSM system 200 may operate by reversing a direction of at least one of the conductive coils (e.g., between two other conductive coils) to switch between the first operating state and the second operating state, thereby moving the cavity from a first position adjacent to the first opening 214 to a second position adjacent to the second opening 216.

Figure 4:
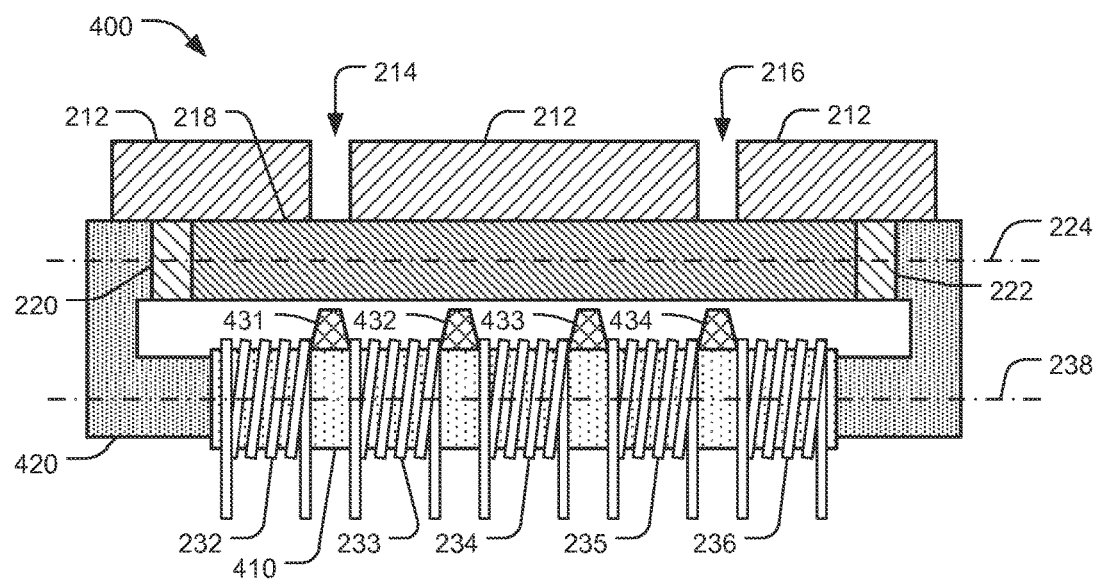
FIG. 4 illustrates a cross section diagram of an embodiment of an electrically driven MSM.

Referring to FIG. 4, a cross section diagram of an embodiment of an electrically driven MSM system 400 is depicted and generally designated 400. The electrically driven MSM system 400 may include the plate 212, the MSM element 218, the anchors 220, 222, and the conductive coils 232-236. The electrically driven MSM system 400 may further include a ferromagnetic core 410 and a conductive yoke 420. The electrically driven MSM system may also include pole pieces 431-434 between the coils and attached to the ferromagnetic core 410 pointing towards the MSM element 218. For example, the pole piece 431 may be positioned between the conductive coils 232, 233, the pole piece 432 may be positioned between the conductive coils 233, 234, the pole piece 433 may be positioned between conductive coils 234, 235, and pole piece 434 may be positioned between the conductive coils 235, 236.

The ferromagnetic core 410 may pass through the plurality of conductive coils 232-236 along a central axis of each conductive coil of the plurality of conductive coils 232-236. For example, the ferromagnetic core 410 may lie along the central axis 238, thereby increasing an intensity of a magnetic field distribution generated by the conductive coils 232-236. The stronger magnetic field distribution may result a greater compression of the MSM element 218 and a larger cavity for pumping during operation. The larger cavity may enable the electrically driven MSM system 400 to pump more fluid as compared to systems that do not include a ferromagnetic core. The ferromagnetic core may also enable operating the pump with smaller current than necessary for operating the pump without ferromagnetic core. The ferromagnetic core may include a ferromagnetic material such as iron, nickel, cobalt, another ferromagnetic material, or a combination thereof.

The yoke 420 may be coupled to the magnetic core 410 and to the anchors 220, 222 to form a closed loop between the MSM element 218 and the ferromagnetic core 410. Similar to the ferromagnetic core 410, the yoke 420 may include a ferromagnetic material such as iron, nickel, cobalt, another ferromagnetic material, or a combination thereof.

Although FIG. 4 depicts the yoke 420 as coupled to the anchors 220, 224, in one or more other embodiments, the magnetic yoke 420 may be in contact with the MSM element 218. For example, other embodiments may not include the anchors 220, 222 and the MSM element 218 may be supported by the yoke 420. Further, although FIG. 4 depicts the ferromagnetic core 410 and the yoke 420 as being distinct, in other embodiments, the ferromagnetic core 410 and the yoke 420 may be combined. The yoke 420 can be made of the same or a different material than the ferromagnetic core 410. In an embodiment, the material is iron-3% silicon. The effect of the ferromagnetic core 410 and the yoke 420 may be enhanced by the pole pieces.

Figure 5:
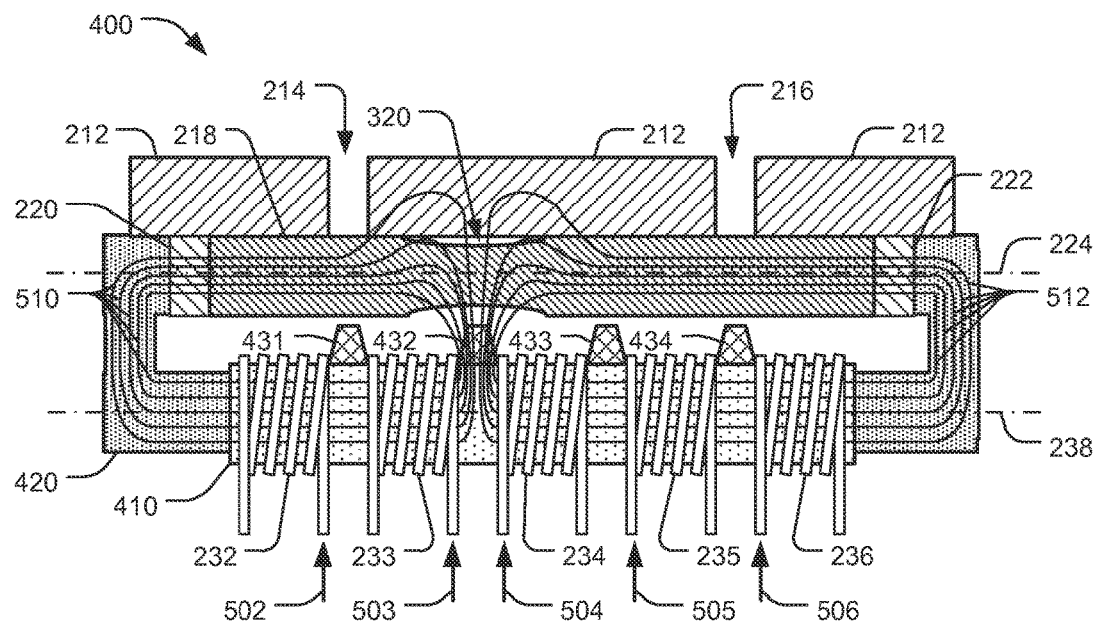
FIG. 5 illustrates a cross section diagram of an embodiment of an electrically driven MSM system depicted in a particular operating state.

Referring to FIG. 5, a cross section diagram of an embodiment of an electrically driven MSM system 400 is depicted in a particular operating state. Although FIG. 5 depicts only one operating state, it should be understood that the electrically driven MSM system 400 may include multiple operating states such that the cavity 320 may be moved between the first opening 214 and the second opening 216 as described with reference to FIGS. 3A-3D.

In the particular operating state, electrical currents 502-506 may be applied to the conductive coils 232-236. The electrical currents 502-506 may induce an electromagnetic field distribution represented by the magnetic field lines 510, 512. Because the magnetic yoke 420 forms a closed loop with the MSM element 218 and the magnetic core 410, the magnetic field may be more inhibited from straying from the electrically driven MSM system 400 as compared to systems that do not include the magnetic yoke such as the electrically driven MSM system 200.

The pole pieces 431-434 may direct the magnetic field lines into the MSM element. For example in the particular operating state, pole piece 432 directs the compressed portion of the magnetic field between the conductive coils 233 and 234 into the MSM element 218.

By directionally limiting the magnetic field distribution, the electrically driven MSM system 500 may be implemented near magnetically sensitive equipment or devices with limited interference from the electrically driven MSM system 500 to the magnetically sensitive equipment or devices.

One or more methods or operations described herein may be performed or initiated by a processor. For example, a computer readable medium may store instructions that, when executed by the processor, cause the processor to initiate or perform one or more operations. The operations may include applying electrical currents through a plurality of conductive coils to generate a magnetic field. The magnetic field may have a magnetic field distribution component that is substantially perpendicular to a longitudinal axis of an MSM element, as described herein. The operations may further include selectively reversing a direction of at least one of the electrical currents to change a position of the magnetic field distribution component relative to the MSM element, as described herein. The processor may include any type of processing device such as a central processing unit (CPU), a digital signal processor (DSP), a peripheral interface controller (PIC), and/or another type of processing element. The computer readable medium may include any type of non-transitory computer readable medium such as a memory element. For example, the computer readable medium may include random access memory (RAM), dynamic RAM (DRAM), read-only memory (ROM), solid state memory, magnetoresistive memory, magnetic disk memory, a compact disc (CD), a digital video disc (DVD), a blu-ray disc, and/or another type of memory element.

Although various embodiments have been shown and described, the present disclosure is not so limited and will be understood to include all such modifications and variations are would be apparent to one skilled in the art.

What is claimed is:

1. A micropump apparatus comprising:
    a plate having a surface with a first opening and a second opening defined therein, the first opening and the second opening passing through the plate;
    a magnetic shape memory (MSM) element positioned flush with the surface and adjacent to the first opening and the second opening, the MSM element configured to contract locally and form a neck that defines a cavity at a portion of the MSM element in response to local exposure, at the portion of the MSM element, to a magnetic field distribution component that is substantially perpendicular to a longitudinal axis of the MSM element; and
    a plurality of conductive coils having a common central axis that is laterally offset from the MSM element, the common central axis substantially parallel to the longitudinal axis of the MSM element, and the plurality of conductive coils spaced along the MSM element from the first opening of the surface to the second opening of the surface.

2. The apparatus of claim 1, wherein the plate is in contact with a surface of the MSM element.

3. The apparatus of claim 2, further comprising at least one anchor fixing a position of the MSM element relative to the plate, relative to the plurality of conductive coils, or both.

4. The apparatus of claim 1, further comprising a ferromagnetic core passing through the plurality of conductive coils along the common central axis.

5. The apparatus of claim 4, further comprising one or more pole pieces coupled to the ferromagnetic core.

6. The apparatus of claim 4, wherein the ferromagnetic core includes iron, nickel, cobalt, or a combination thereof.

7. The apparatus of claim 4, further comprising a yoke coupled to the ferromagnetic core.

8. The apparatus of claim 7, wherein the yoke forms a loop with the MSM element and the ferromagnetic core.

9. The apparatus of claim 1, wherein the MSM element includes nickel, manganese, gallium, or a combination thereof.

10. The apparatus of claim 1, wherein the plurality of conductive coils includes at least three conductive coils positioned at intervals along the MSM element.

11. The apparatus of claim 1, further comprising a controller coupled to the plurality of conductive coils, wherein the controller is configured to:
- apply electrical currents to a first set of the plurality of coils to induce a magnetic field in a first direction;
- apply electrical currents to a second set of the plurality of coils to induce a magnetic field in a second direction opposite the first direction; and
- reverse a direction of at least one of the electrical currents.

12. The apparatus of claim 1, wherein the cavity is defined between the portion of the MSM element and the surface.

13. The apparatus of claim 12, wherein the MSM element is further configured to uncontract at the portion of the MSM element and to contract at another portion of the MSM element in response to a movement of the magnetic field distribution component.

14. The apparatus of claim 12, wherein a position of the cavity is changed in response to changing a position of the magnetic field distribution component.

* * * * *